United States Patent [19]
Yasumura et al.

[11] Patent Number: 5,895,954
[45] Date of Patent: Apr. 20, 1999

[54] FIELD EFFECT TRANSISTOR WITH IMPURITY CONCENTRATION PEAK UNDER GATE ELECTRODE

[75] Inventors: Kenji Yasumura; Takaaki Murakami, both of Hyogo, Japan

[73] Assignee: Mitsubishi Denki Kabushiki Kaisha, Tokyo, Japan

[21] Appl. No.: 08/917,929

[22] Filed: Aug. 27, 1997

[30] Foreign Application Priority Data

Mar. 27, 1997 [JP] Japan .................................. 9-076158

[51] Int. Cl.⁶ .................................................... H01L 21/335
[52] U.S. Cl. ............................ 257/345; 257/285; 438/289; 438/290
[58] Field of Search .............................. 257/345, 285; 438/289, 290, 291

[56] References Cited

U.S. PATENT DOCUMENTS 5,391,508  2/1995  Matsuoka et al. ..................... 257/336
5,449,937  9/1995  Arimura et al. ....................... 257/345
5,792,699  8/1998  Tsui ....................................... 438/290

OTHER PUBLICATIONS

Explanation of Reverse Short Channel . . . , C.S. Rafferty et al., IEEE 1993, pp. 311–314.
Guidelines for Reverse Short–Channel Behavior, C. Mazure et al . . . , IEEE Electron Device Letters, vol. 10, No. 12, Dec. 1989 pp. 556–558.

Primary Examiner—Olik Chaudhuri
Assistant Examiner—Mike Dietrich
Attorney, Agent, or Firm—McDermott, Will & Emery

[57] ABSTRACT

Reverse short-channel effect is suppressed in a field effect transistor with a gate having a short length. The field effect transistor comprises a p-type silicon substrate, a gate electrode, paired lightly doped source/drain regions, and paired heavily doped source/drain regions. A boron concentration peak region is formed in the silicon substrate. A boron concentration peak region positioned at an end of the gate electrode has a length d of one fourth of a length L of the gate electrode, and extends from the end to the center of the gate electrode.

8 Claims, 11 Drawing Sheets

5,895,954

1

FIELD EFFECT TRANSISTOR WITH IMPURITY CONCENTRATION PEAK UNDER GATE ELECTRODE

BACKGROUND OF THE INVENTION

1. Field of the Invention

The present invention relates to a field effect transistor and a method of manufacturing the same and particularly to a field effect transistor with a gate electrode having a short length and a method of manufacturing the same.

2. Description of the Background Art

Recently, as semiconductor integrated circuit devices are significantly highly integrated, submicrofabrication of elements is rapidly improved. In particular, for a dynamic random access memory (DRAM) as a semiconductor memory device, the integration degree of a memory is increased as its storage capacity is increased from 64 megabits to 256 megabits and furthermore to 1 gigabit. A field effect transistor as an active element which configures such a highly integrated memory must have a submicrofabricated structure.

It is well known that as the length of a gate electrode of a field effect transistor is decreased, drop of the threshold voltage of the field effect transistor, so-called short channel effect, is found. However, when the length of a gate electrode is as extremely short as no more than 0.5 μm, the amount of boron doping is increased to enhance punchthrough resistance, and consequently reverse short-channel effect, increase of threshold voltage, is found simultaneously with short-channel effect.

FIG. 15 is a partial cross sectional view of a structure in cross section of a field effect transistor immediately after impurity ion injection for forming a source/drain region. As shown in FIG. 15, a silicon substrate 1 has a boron doped region 60 formed for controlling the threshold voltage of the field effect transistor. A gate electrode 3 is formed on silicon substrate 1 with a gate oxide film 2 disposed therebetween. A sidewall oxide film 4 is formed at a sidewall of gate electrode 3. The field effect transistor has LDD structure and includes a pair of lightly doped source/drain regions 51 and a pair of highly doped source/drain regions 52. In the vicinity of the source/drain region immediately after the impurity ion injection, lattice defect, such as interstitial atoms and dislocation loops formed due to the impurity ion injection, is found.

When heat treatment is performed on silicon substrate 1 in the above condition, coupled diffusion of boron (B) atoms contained in boron doped region 60 and the lattice defect is caused. Ultimately, boron concentration peak regions 161, 162 and 163 are formed, as shown in FIG. 16. Boron concentration peak regions 161 and 162 exist in silicon substrate 1 at a certain depth. Boron concentration peak region 163 exists under gate electrode 3 at a surface region of silicon substrate 1. Thus, boron concentration is high at a surface (an interface) of silicon substrate 1 closer to an end of gate electrode 3.

For a long length of an gate electrode, a length d of boron concentration peak region 163 existing at a surface of silicon substrate 1 is relatively short with respect to a length L of the gate electrode and thus reverse short-channel effect is not found. When length L of the gate electrode is decreased, however, the amount of boron doping is increased to enhance punchthrough resistance. This causes length d of boron concentration peak region 163 to be relatively increased with respect to length L of the gate electrode and thus reverse short-channel effect appears.

2

FIG. 17 shows short-channel effect. As shown in FIG. 17, as gate length is reduced, threshold voltage Vth suddenly drops.

FIG. 18 illustrates reverse short-channel effect found when the gate length is decreased and the amount of boron doping is increased accordingly to enhance punchthrough resistance, as described above. As shown in FIG. 18, as the gate length is decreased in the area representing the relatively long gate length, threshold voltage Vth is increased and the so-called reverse short-channel effect is caused. As the gate length is further reduced, the boron concentration is decreased at the surface of silicon substrate 1 at the center of gate electrode 3, as shown in FIG. 16. This readily causes punchthrough and short-channel effect becomes more significant, as shown in FIG. 18.

In particular, a field effect transistor applied for a DRAM of 1 gigabit has a gate length of approximately 0.15 μm and thus a relatively high ratio of length d of boron concentration peak region 163 to gate length L is obtained. Thus, reverse short channel effect and short channel effect such as those described above become significant, good transistor characteristics cannot be obtained and the field effect transistor will not operate properly.

As shown in FIG. 18, when reverse short-channel effect is found in the area representing the relatively long gate length, a significant short-channel effect is found in the area representing the relatively short gate length. In other words, the amount in reduction of threshold voltage with respect to change of gate length is more increased. When the dependence of threshold voltage on gate length is thus increased, characteristics of the field effect transistor is significantly changed depending on slight variations of process precision.

SUMMARY OF THE INVENTION

An object of the present invention is to suppress reverse short-channel effect in a field effect transistor with a gate electrode having a short length.

Another object of the present invention is to manufacture a field effect transistor with a gate electrode having a short length, capable of suppressing reverse short-channel effect.

A field effect transistor in one aspect of the present invention, having a gate electrode of a length (L) of not more than 0.50 μm, includes a semiconductor substrate of a first conductivity having a main surface, a gate electrode formed on the main surface of the semiconductor substrate with a gate insulating film disposed therebetween, and a pair of impurity regions of second conductivity formed in a region of the semiconductor substrate at both sides of the gate electrode. In a surface region of the semiconductor substrate located under the gate electrode, an impurity concentration peak of the first conductivity exists at the surface region starting from an end of the gate electrode in the direction of the center of the gate electrode to a point spaced apart from the end of the gate electrode by not more than L/4.

In the field effect transistor thus structured, a concentration peak of an impurity dopant of the first conductivity for controlling the threshold voltage is found in the surface region of the semiconductor substrate located under the gate electrode at an limited region starting from an end of the gate electrode towards the center of the gate electrode. This can suppress reverse short-channel effect and an field effect transistor of good characteristics can be obtained. When the length of the gate electrode is extremely reduced, characteristics of the field effect transistor will not be significantly changed depending on slight variations of process precision.

In the field effect transistor according to the present invention, reverse short-channel effect is effectively suppressed as described above when the value of the impurity concentration peak of the first conductivity for enhancing punchthrough resistance is at least $8.0 \times 10^{16}$ cm$^{-3}$.

The aforementioned suppression of reverse short-channel effect can be effectively achieved when the length of the gate electrode is preferably not more than 0.35 µm, more preferably not more than 0.25 µm, still more preferably not more than 0.15 µm.

When the length of the gate electrode is not more than 0.35 µm, the value of the impurity concentration peak of the first conductivity for enhancing punchthrough resistance is preferably at least $1.0 \times 10^{17}$ cm$^{-3}$.

When the length of the gate electrode is not more than 0.25 µm, the value of the impurity concentration peak of the first conductivity for enhancing punchthrough resistance is preferably at least $5.0 \times 10^{17}$ cm$^{-3}$.

When the length of the gate electrode is not more than 0.15 µm, the value of the impurity concentration peak of the first conductivity for enhancing punchthrough resistance is preferably at least $8.0 \times 10^{17}$ cm$^{-3}$.

A method of manufacturing a field effect transistor according to the present invention is that of manufacturing a field effect transistor with a gate electrode length of not more than 0.50 µm and includes the following steps of:

(a) ion-implanting an impurity of a first conductivity to a main surface of a semiconductor substrate of the first conductivity;

(b) forming a gate electrode on the main surface of the semiconductor substrate with a gate insulating film disposed therebetween;

(c) ion-implanting an impurity of a second conductivity into a region of the semiconductor substrate at both sides of the gate electrode to form a pair of impurity regions of the second conductivity; and (d) applying rapid thermal annealing to the semiconductor substrate.

In another aspect of the present invention, a method of manufacturing a field effect transistor includes the following steps of:

(a) ion-implanting an impurity of a first conductivity to a main surface of a semiconductor substrate of the first conductivity;

(b) forming a gate electrode on the main surface of the semiconductor substrate with a gate insulating film disposed therebetween; and (c) forming a pair of impurity regions of a second conductivity in a region of the semiconductor substrate at both sides of the gate electrode using ion shower doping or plasma doping.

In the method of manufacturing the field effect transistor in the above another aspect of the present invention, the step of forming a pair of impurity regions of the second conductivity may be followed by the step of applying rapid thermal annealing to the semiconductor substrate.

In a still another aspect of the present invention, a method of manufacturing a field effect transistor includes the following steps of:

(a) ion-implanting an impurity of a first conductivity to a main surface of a semiconductor substrate of the first conductivity;

(b) forming a gate electrode on the main surface of the semiconductor substrate with a gate insulating film disposed therebetween;

(c) forming an epitaxial layer on the main surface of the semiconductor substrate at both sides of the gate electrode, the epitaxial layer being doped with an impurity of a second conductivity; and (d) diffusing the impurity of the second conductivity from the epitaxial layer by rapid thermal annealing to form a pair of impurity regions of the second conductivity in a region of the semiconductor substrate at the both sides of the gate electrode.

In any of the methods of manufacturing a field effect transistor, an impurity concentration peak of the first conductivity can be formed in the surface region of the semiconductor substrate positioned under the gate electrode at a limited surface region starting from an end of the gate electrode in the direction of the center of the gate electrode to a point spaced apart from the end of the gate electrode by not more than L/4, to suppress reverse short-channel effect. Thus, a field effect transistor having a reduced length of the gate electrode, capable of suppressing reverse short-channel effect, can be readily obtained without any complicated manufacturing process.

Thus, a field effect transistor with an gate electrode having a length of not more than 0.5 µm according to the present invention can suppress reverse short-channel effect.

For a gate electrode having a length of not more than 0.5 µm, punchthrough resistance is enhanced and reverse short-channel effect is suppressed when the value of the impurity concentration peak of the first conductivity is at least $8.0 \times 10^{16}$ cm$^{-3}$.

Suppression of reverse short-channel effect is more effectively achieved when the length of the gate electrode is preferably not more than 0.35 µm, more preferably not more than 0.25 µm, still more preferably not more than 0.15 µm.

For a gate electrode having a length of not more than 0.35 µm, not more than 0.25 µm and not more than 0.15 µm, punchthrough resistance is enhanced and reverse short-channel effect is suppressed when the value of the impurity concentration peak of the first conductivity is at least $1.0 \times 10^{17}$ cm$^{-3}$, at least $5.0 \times 10^{17}$ cm$^{-3}$ and at least $8.0 \times 10^{17}$ cm$^{-3}$, respectively, and an field effect transistor with good characteristics is thus obtained.

According to a method of manufacturing a field effect transistor according to the present invention, a field effect transistor with a gate electrode having a length of not more than 0.50 µm, capable of suppressing reverse short-channel effect, can be readily obtained without any complicated manufacturing process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
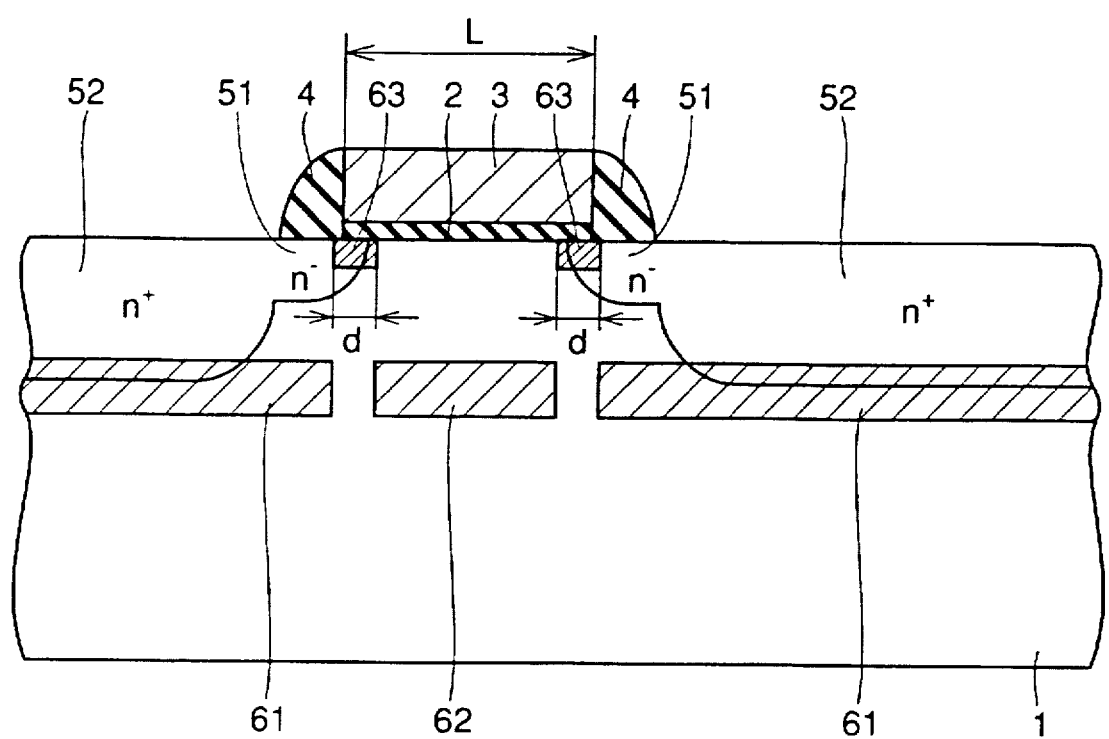
FIG. 1 is a partial cross sectional view of a structure of a field effect transistor according to a first embodiment.

As shown in FIG. 1, a gate electrode 3 is formed on a p-type silicon substrate 1 with a gate oxide film 2 disposed therebetween. A sidewall oxide film 4 is formed at a sidewall of gate electrode 3. The length of gate electrode 3 is not more than 0.5 μm. The thickness of gate electrode 3 is 80 nm–200 nm, and the thickness of gate oxide film 2 is 3 nm–15 nm. The width of sidewall oxide film 4 is 30 nm–80 nm.

A pair of source/drain regions are formed in a region of silicon substrate 1 at both sides of gate electrode 3. A source/drain region is formed of an n-type lightly doped source/drain region 51 and an n-type heavily doped source/drain region 52 which is formed following the formation of n-type lightly doped source/drain region 51.

The field effect transistor has gate electrode 3, a pair of lightly doped source/drain regions 51, and a pair of heavily doped source/drain regions 52. Silicon substrate 1 is doped with boron to control threshold voltage Vth of the field effect transistor. The region doped with boron as a p-type impurity finally has boron concentration peak regions 61, 62 and 63, as shown in FIG. 1. Boron concentration peak regions 61 and 62 exist in silicon substrate 1 at a certain depth. Boron concentration peak region 63 exists in the surface region of silicon substrate 1 positioned under gate electrode 3 at a surface region starting-from an end of gate electrode 3 to a point closer to the center of gate electrode 3 than the end of gate electrode and spaced apart from the end of gate electrode 3 by at most one fourth of the length of the gate electrode 3. In other words, length d of boron concentration peak region 63 is not more than one fourth of length L of the gate electrode.

When length L of the gate electrode is not more than 0.5 μm, the peak concentration of boron concentration peak region 63 is at least $8.0 \times 10^{16}$ cm$^{-3}$. When length L of the gate electrode is not more than 0.35 μm, the peak concentration of boron concentration peak region 63 is at least $1.0 \times 10^{17}$ cm$^{-3}$. When length L of the gate electrode is not more than 0.25 μm, the peak concentration of boron concentration peak region 63 is at least $5.0 \times 10^{17}$ cm$^{-3}$. When length L of the gate electrode is not more than 0.15 μm, the peak concentration of boron concentration peak region 63 is at least $8.0 \times 10^{17}$ cm$^{-3}$. In this way, boron is implanted at a predetermined concentration to enhance punchthrough resistance, depending on the length of the gate electrode.

Figure 2:
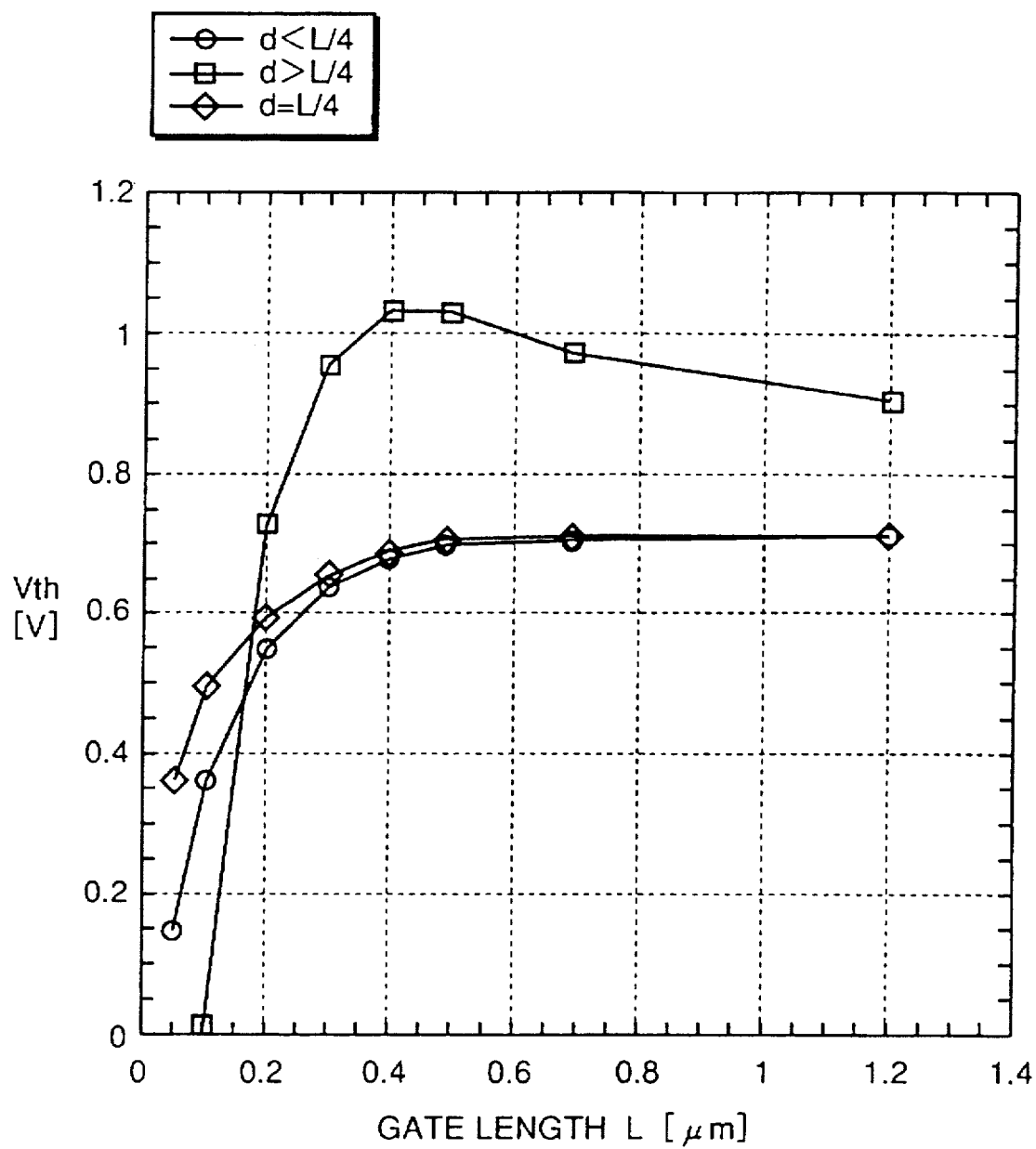
FIG. 2 illustrates a correlation between gate length and threshold voltage when the correlation in magnitude between length d of a boron concentration peak region at the surface region of a silicon substrate positioned under the gate electrode and one fourth of the length of the gate electrode (L/4) is changed.

FIG. 2 illustrates a correlation between gate length L μm and threshold voltage Vth V of the field effect transistor shown in FIG. 1. As shown in FIG. 2, for a boron concentration peak region 63 with a length d of not more than L/4, reverse short-channel effect is not found and only short-channel effect is found. For a boron concentration peak region 63 with a length d of more than L/4, as gate length L is reduced, threshold voltage Vth is first increased, and as gate length L is further reduced, threshold voltage Vth is reduced. That is, reverse short-channel effect is found when length d of boron concentration peak region 63 is larger than L/4. It is noted that FIG. 2 shows a simulation result when only gate length L is changed under the conditions for designing a field effect transistor having a gate length L of 0.4 μm. Thus, as shown in FIG. 2, for a boron concentration peak region 63 having a length of not more than L/4, a threshold voltage Vth as aimed can be obtained when a field effect transistor has a gate length L of 0.4 μm.

Figure 3:
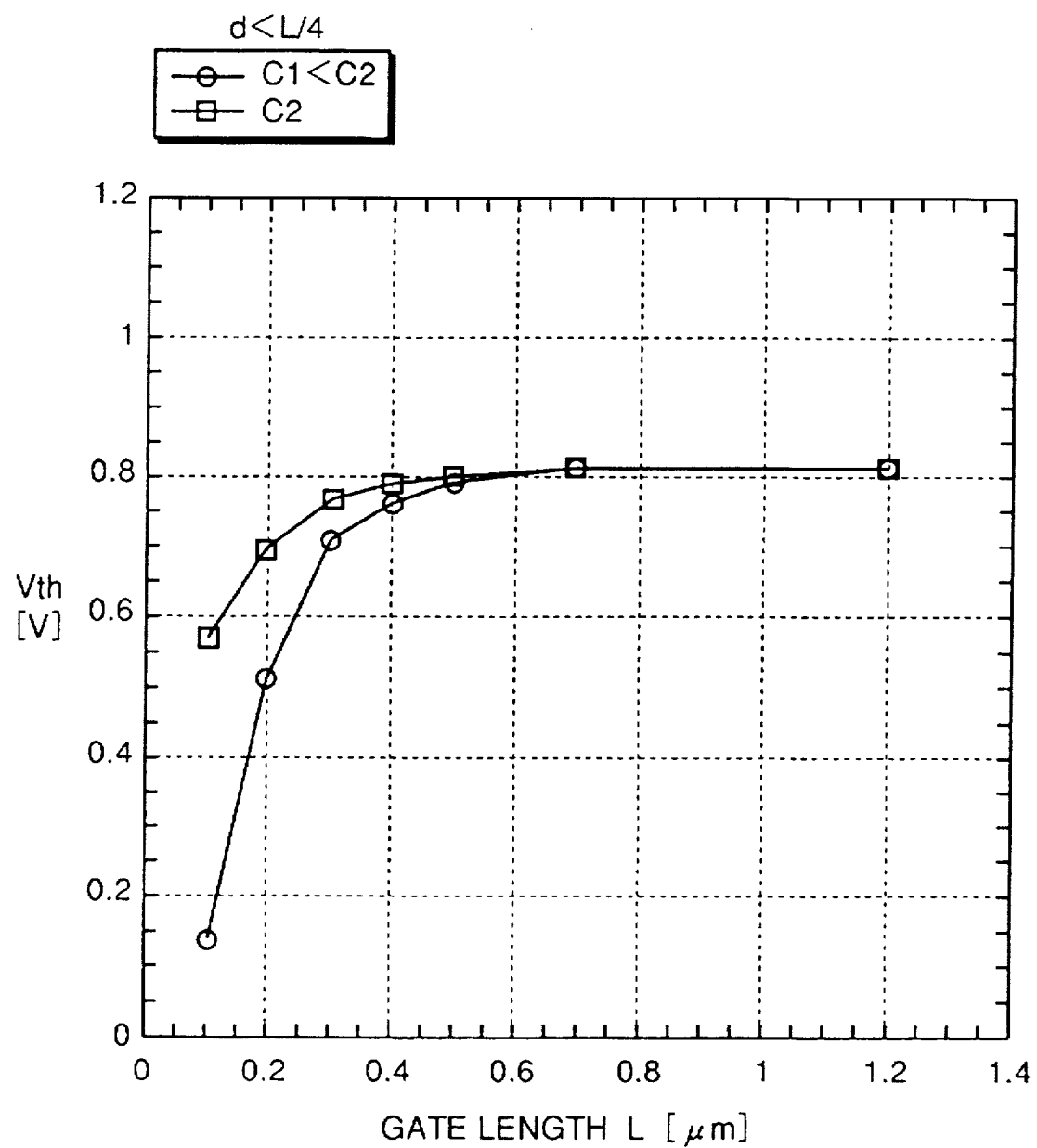
FIG. 3 illustrates a correlation between gate length and threshold voltage when length d of the boron concentration peak region at the surface region of the silicon substrate positioned under the gate electrode is shorter than one fourth of the length of the gate electrode (L/4) according to the present invention.

FIG. 3 is a simulation result when an aimed gate length L is 0.4 μm and the other conditions are set accordingly, and shows a correlation between gate length and threshold voltage of a field effect transistor when length d of boron concentration peak region 63 is shorter than L/4. FIG. 3 shows gate length-threshold voltage characteristics for both high peak concentration (C2=$8.0 \times 10^{16}$ cm$^{-3}$) and low peak concentration (C1=$3.0 \times 10^{16}$ cm$^{-3}$) of boron. It is found that for a length d of boron concentration peak region 63 shorter than L/4 according to the present invention, reverse short-channel effect is not caused when peak-concentration of boron is increased. This means that reverse short-channel effect will not be caused when the amount of boron as a dopant for adjusting the threshold voltage to enhance punchthrough resistance as gate length L is reduced is increased.

Figure 4:
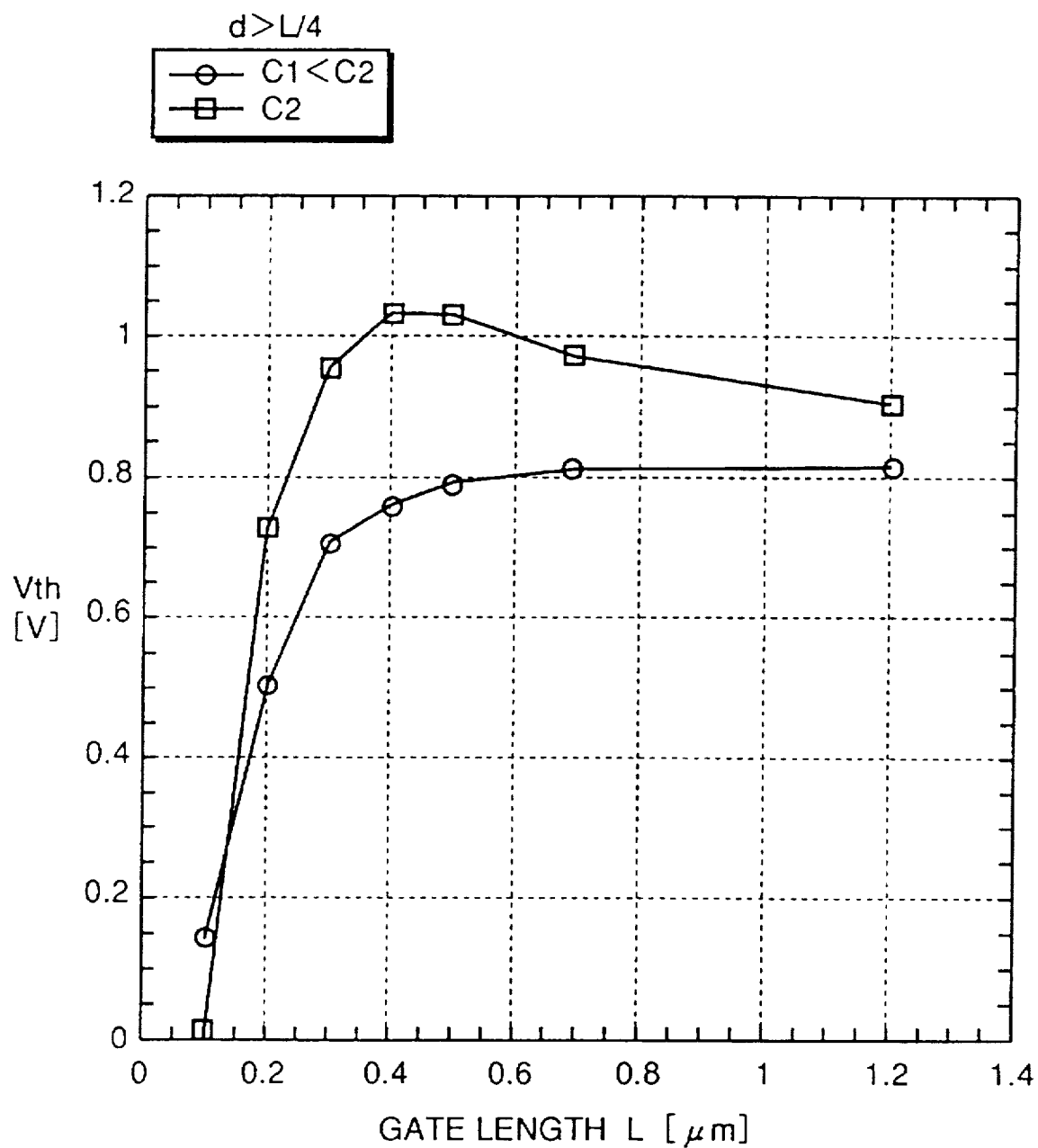
FIG. 4 illustrates a correlation between gate length and threshold voltage when length d of the boron concentration peak region at the surface region of a silicon substrate positioned under the gate electrode is longer than one fourth of the length of the gate electrode (L/4) in a conventional field effect transistor.

FIG. 4 shows gate length-threshold voltage characteristics of a field effect transistor when length d of boron concentration peak region 63 is larger than L/4. It also shows a simulation result when an aimed gate length L is 0.4 μm and the other conditions are set accordingly. As shown in FIG. 4, reverse short-channel effect is not found for the lower peak concentration (C1) of boron, whereas reverse short-channel effect is found as the peak concentration of boron is increased (C2). Thus, when length d of boron concentration peak region 63 is longer than L/4 in a conventional field effect transistor, reverse short-channel effect is found as the peak concentration of boron is increased to enhance punchthrough resistance and this makes it difficult to obtain a field effect transistor which exhibits characteristics equivalent to a design value.

Second Embodiment

A method of manufacturing the field effect transistor shown in FIG. 1 will now be described with reference to FIGS. 5–10.

Figure 5:
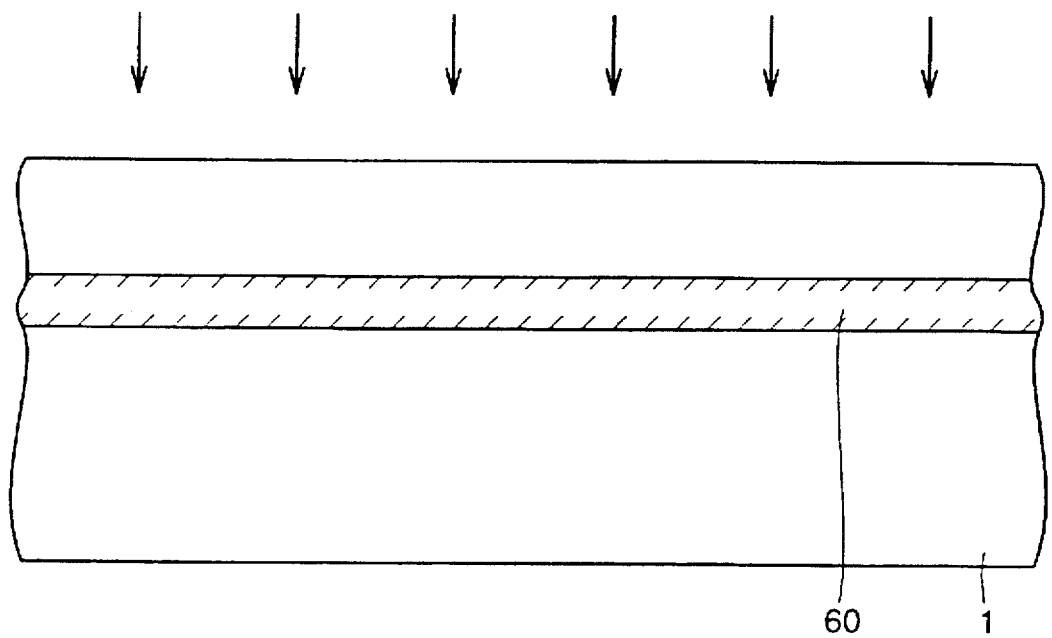
FIGS. 5–10 are partial cross sectional views showing steps of a method of manufacturing a field effect transistor according to a second embodiment in the order of process step.

As shown in FIG. 5, a predetermined dose of boron as a p-type impurity is ion-implanted into p-type silicon substrate 1. A boron doped region 60 is thus formed in silicon substrate 1. In the boron ion implantation in this example, with the acceleration voltage being 10 keV–50 keV, the dose is at least $8 \times 10^{11}$ cm$^{-2}$ when gate length L is not more than 0.5 µm in a field effect transistor manufactured, the dose is at least $1.0 \times 10^{12}$ cm$^{-2}$ when gate electrode length L is not more than 0.35 µm, the dose is at least $5.0 \times 10^{12}$ cm$^{-2}$ when gate electrode length L is not more than 0.25 µm, and the dose is at least $8.0 \times 10^{12}$ cm$^{-2}$ when gate electrode length L is not more than 0.15 µm.

Figure 6:
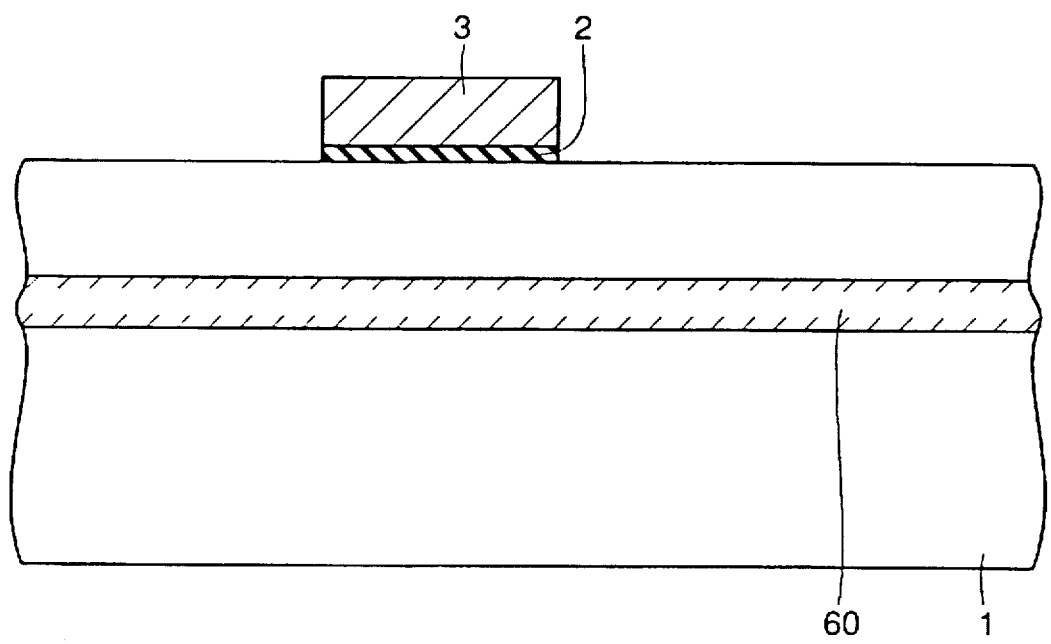

Then, gate oxide film 2 having a film thickness of 3 nm–15 nm is formed and gate electrode 3 having a film thickness of 80 nm–200 nm is formed thereon, as shown in FIG. 6.

Figure 7:
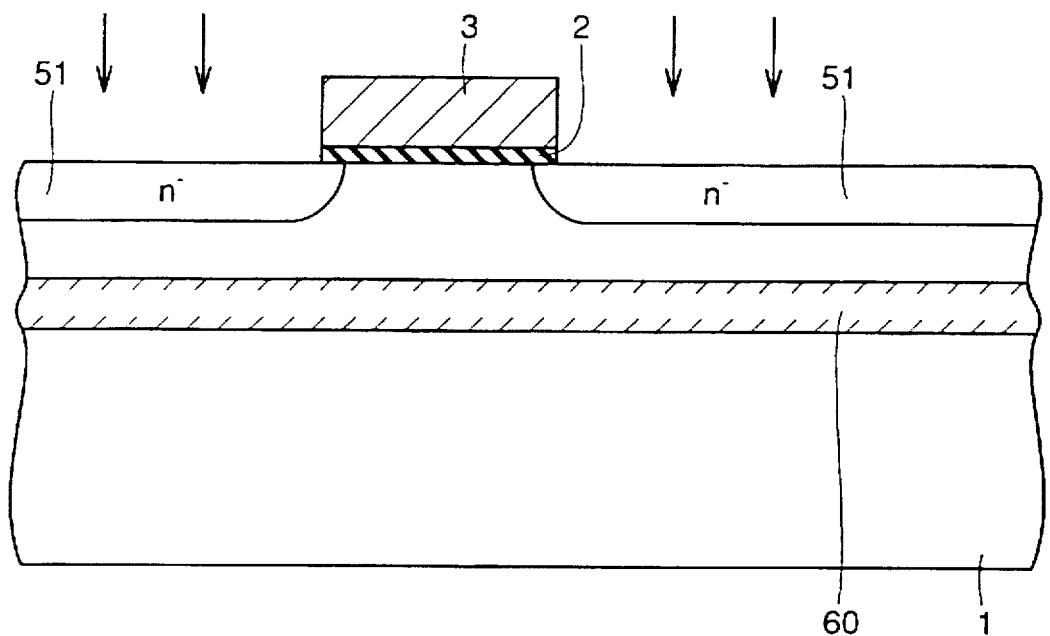

As shown in FIG. 7, gate electrode 3 is used as a mask and phosphorus (P) or arsenic (As) is ion-implanted into a region of silicon substrate 1 in the direction indicated by the arrows with the acceleration voltage being 10 keV–50 keV and the dose being $1 \times 10^{13}$ cm$^{-2}$–$10 \times 10^{13}$ cm$^{-2}$. Thus, n-type, lightly doped source/drain region 51 which forms a source/drain region is formed.

Rapid thermal annealing is then applied immediately after the ion implantation to remove the lattice defect formed in the ion implantation. The rapid thermal annealing uses a halogen lamp or the like as a heat supply and is applied at a temperature of 700° C.–1000° C. for 15 seconds–60 seconds.

Figure 8:
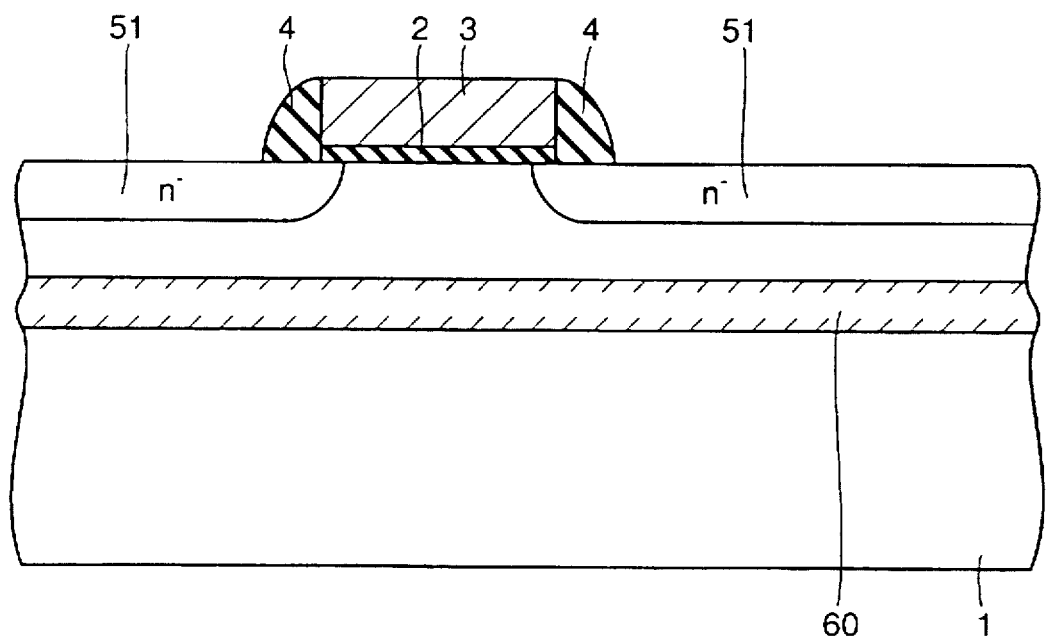

Then, sidewall oxide film 4 having a width of 30 nm–80 nm is formed at a side surface of gate electrode 3, as shown in FIG. 8.

Figure 9:
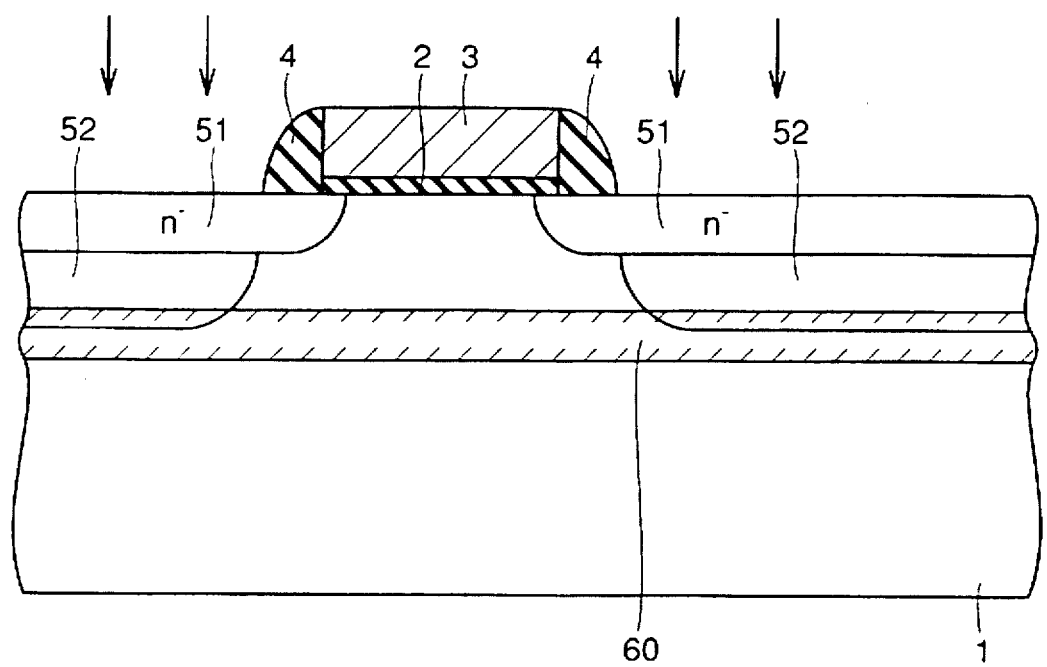
Figure 10:
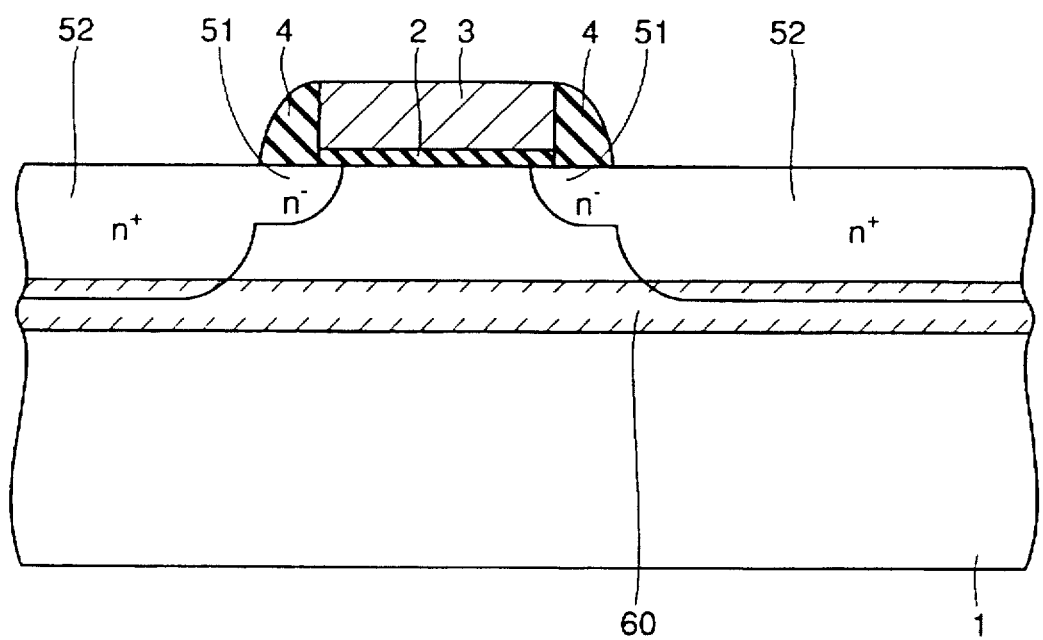
Figure 11:
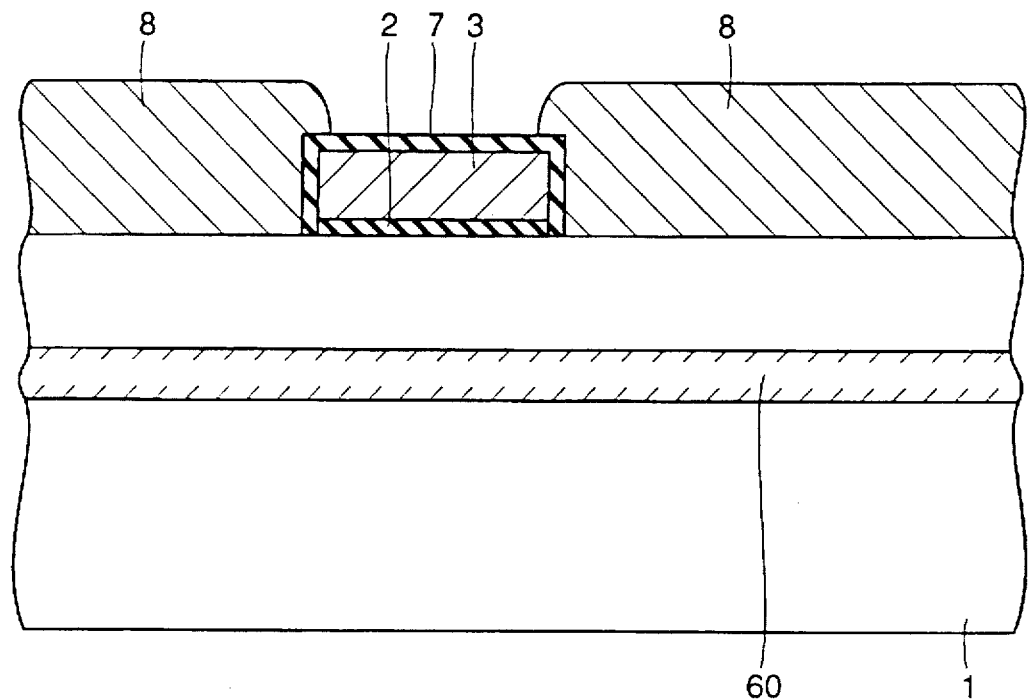
FIGS. 11 and 12 are partial cross sectional views showing steps of a method of manufacturing a field effect transistor according to a fourth embodiment in the order of process step.

As shown in FIG. 9, gate electrode 3 and sidewall oxide film 4 are used as a mask and phosphorus (P) or arsenic (As) is ion-implanted into a region of silicon substrate 1 in the direction indicated by the arrows with the acceleration voltage being 10 keV–70 keV and the dose being $1 \times 10^{14}$ cm$^{-2}$–$5 \times 10^{15}$ cm$^{-2}$. Thus, n-type, heavily doped source/drain region 52 is formed.

Rapid thermal annealing is again applied immediately after the ion-implantation to remove the lattice defect newly caused by the ion implantation. The rapid thermal annealing is applied at a temperature of 700° C.–1000° C. for 15 seconds to 60 seconds.

It is noted that when ion implantation for forming lightly doped source/drain region 51 is not performed, the aforementioned rapid thermal annealing is applied only immediately after the ion implantation for forming heavily doped source/drain region 52.

Figure 16:
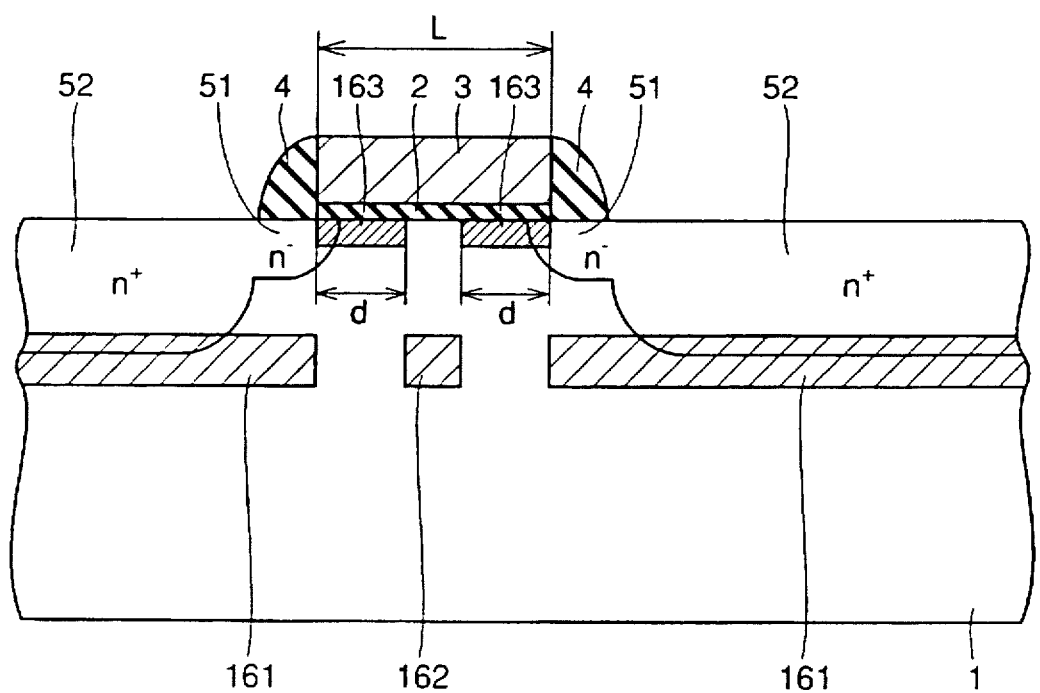
FIG. 16 is a partial cross sectional view of a structure of a conventional field effect transistor.
Figure 17:
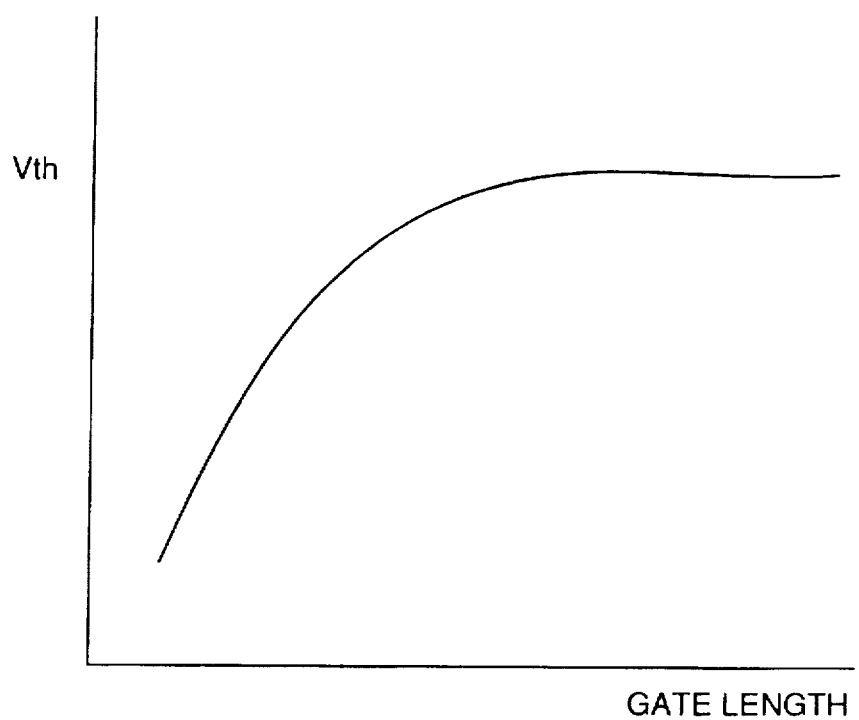
FIG. 17 illustrates a correlation between gate length and threshold voltage for illustrating short-channel effect.
Figure 18:
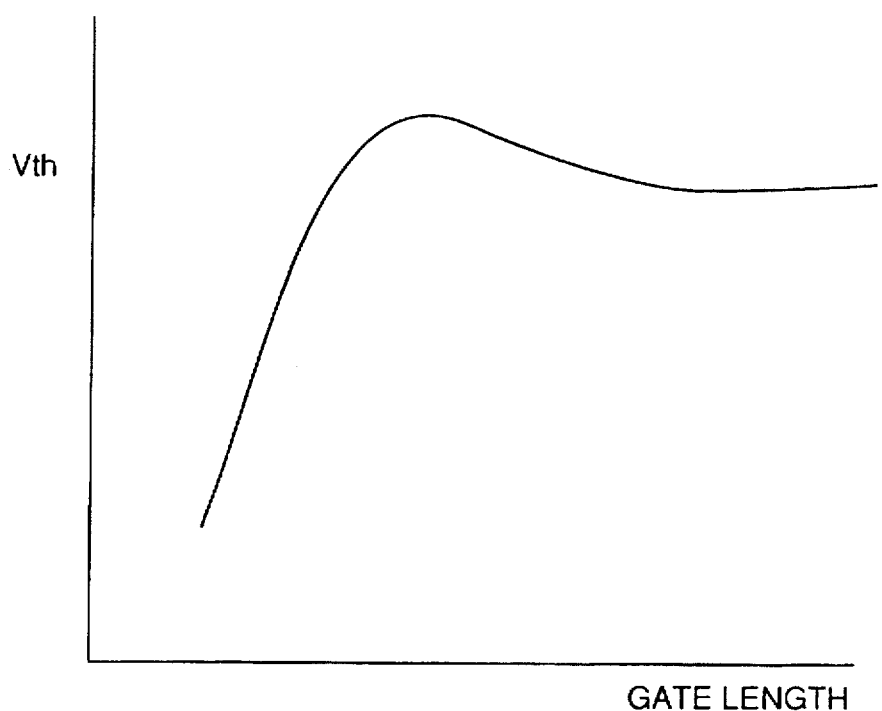
FIG. 18 illustrates a correlation between gate length and threshold voltage for illustrating reverse short-channel effect.

Then, thermal annealing in a furnace is applied to obtain a field effect transistor having boron concentration peak regions 61, 62 and 63 formed as shown in FIG. 1. When rapid thermal annealing is not applied immediately after each ion implantation in the above manufacturing method, boron concentration peak regions 161, 162 and 163 such as those shown in FIG. 16 are formed.

The application of rapid thermal annealing in the above manufacturing method allows recombination and hence reduction of the lattice defect which has been formed by ion implantation. Thus, coupled diffusion of boron (B) ions and interlattice defects can be suppressed in the thermal annealing finally performed in the furnace. Consequently, increase in boron concentration can be suppressed at an interface (a surface of the silicon substrate) and reverse short-channel effect can be reduced.

Third Embodiment

In the above manufacturing method, the ion implantations for forming lightly doped source/drain region 51 and heavily doped source/drain region 52 can be performed such that the ion implantations are accompanied with reduced damage, thereby obtaining a field effect transistor which exhibits an effect similar to that of the field effect transistor obtained as mentioned above.

For example, the aforementioned ion implantations are performed through ion shower doping. In this example, the ion implantations for forming lightly doped source/drain region 51 and heavily doped source/drain region 52 is performed with the acceleration voltage being 5 keV–50 keV and the dose being $1 \times 10^{13}$ cm$^{-2}$–$5 \times 10^{15}$ cm$^{-2}$.

Plasma doping may be used instead of ion shower doping.

According to the present embodiment, injection with reduced damage, such as ion shower doping and plasma doping, is applied and rapid thermal annealing immediately after the injection is not basically required. However, as is similar to the second embodiment, rapid thermal annealing may be applied immediately after the formation of lightly doped source/drain region 51 and immediately after the formation of heavily doped source/drain region 52.

Fourth Embodiment

After the step shown in FIG. 6 in the second embodiment, an oxide film 7 having a thickness of 5 nm–50 nm is formed on a side surface and a top surface of gate electrode 3. Then, a silicon epitaxial layer 8 doped with phosphorus (P) or arsenic (As) is formed. The dope for silicon epitaxial layer 8 is $5 \times 10^{19}$ cm$^{-3}$–$5 \times 10^{20}$ cm$^{-3}$. Silicon epitaxial layer 8 may be formed of polycrystalline silicon.

Figure 12:
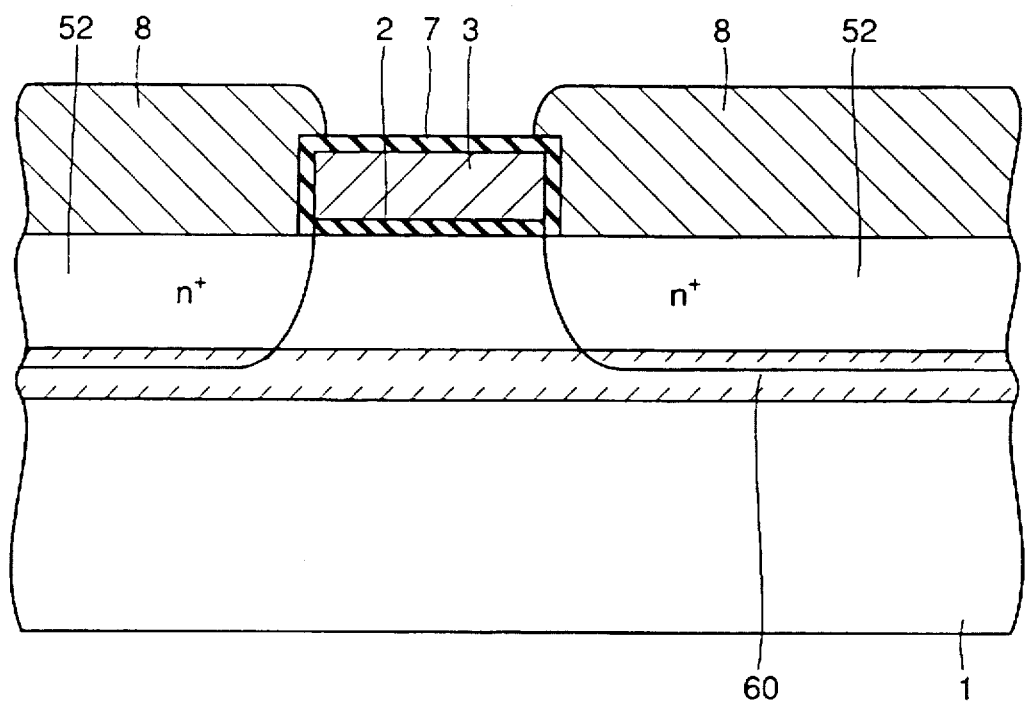

As shown in FIG. 12, rapid thermal annealing is then applied immediately after the formation of doped silicon epitaxial layer 8 and the phosphorus (P) or arsenic (As) contained in epitaxial layer 8 is thus diffused into silicon substrate 1 to form highly doped source/drain region 52. The rapid thermal annealing is applied at a temperature of 900° C.–1000° C. for 30 seconds to 3 minutes.

Figure 13:
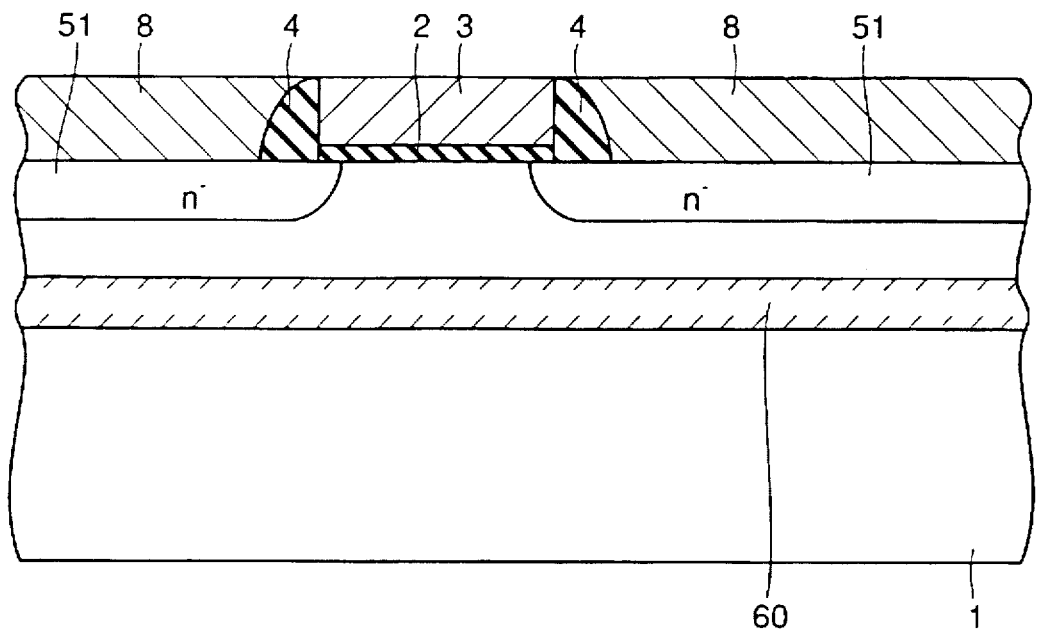
FIGS. 13 and 14 are cross sectional views showing steps of a method of manufacturing a field effect transistor according to another example of the fourth embodiment in the order of process step.
Figure 14:
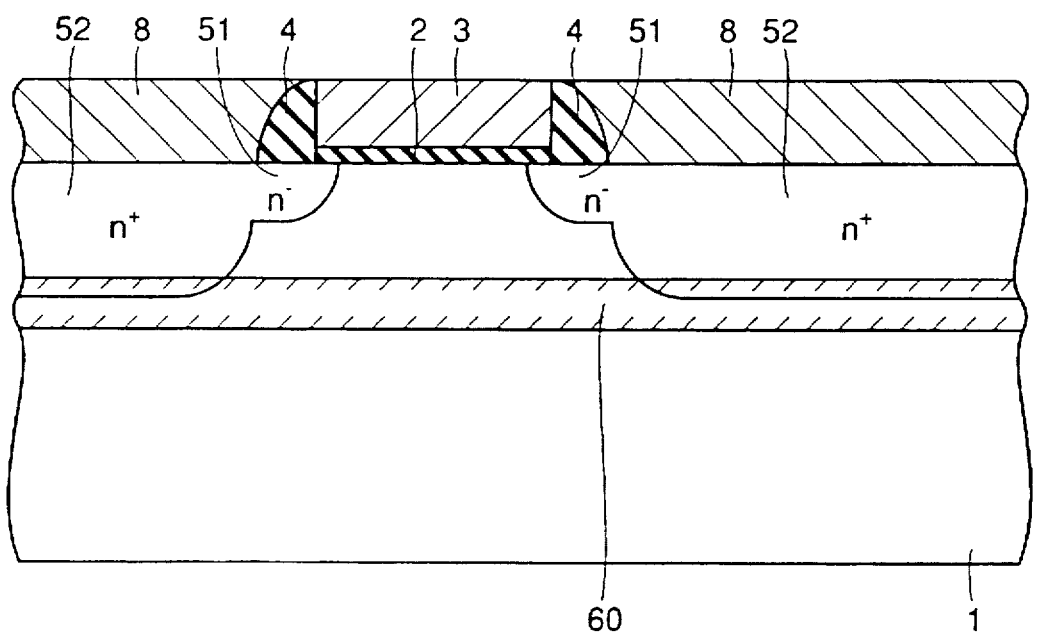
Figure 15:
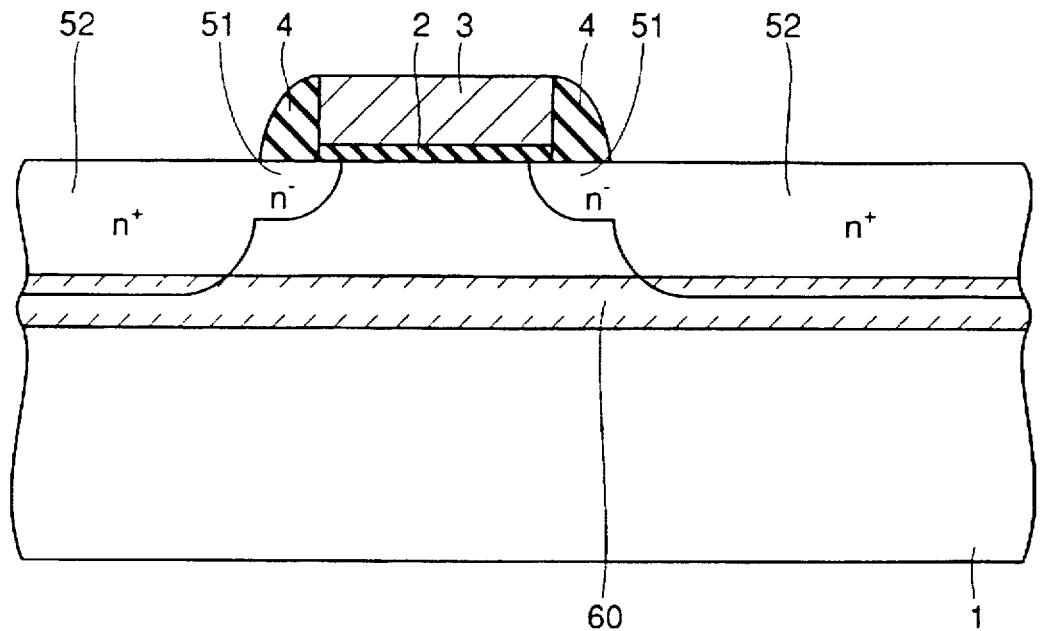
FIG. 15 is a partial cross sectional view of a structure immediately after the ion implantation for forming a source/drain region in a conventional method of manufacturing a field effect transistor.

After the step shown in FIG. 8 in the second embodiment, doped silicon epitaxial layer 8 may be formed, as shown in FIG. 13, and rapid thermal annealing may then be applied to diffuse the phosphorus (P) or arsenic (As) contained in doped silicon epitaxial layer 8 and thus form heavily doped source/drain region 52.

In the above manufacturing steps, lightly doped source/drain region 51 may be formed employing ion shower doping or plasma doping according to the third embodiment. In this example, rapid thermal annealing may be applied immediately after the formation of lightly doped source/drain region 51.

While heavily doped source/drain region 52 is formed by the diffusion from doped silicon epitaxial layer 8 in the above manufacturing steps, lightly doped source/drain region 51 may also be formed by diffusion from doped silicon epitaxial layer 8. In this example, a doped silicon epitaxial layer is formed with sidewall oxide film 4 having a width of approximately 3 nm, and a lightly doped source/drain region is formed by diffusion from the epitaxial layer. Then, heavily doped source/drain region 52 may be formed employing a method according to the second embodiment or the third embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor with a gate electrode having a length (L) of not more than 0.50 μm, comprising:

a semiconductor substrate of a first conductivity having a main surface;

a gate electrode formed on the main surface of said semiconductor substrate with a gate insulating film disposed therebetween; and a pair of impurity regions of a second conductivity formed in a region of said semiconductor substrate at both sides of said gate electrode; wherein an impurity concentration peak of the first conductivity exists in a surface region of said semiconductor substrate positioned under said gate electrode spaced apart from each end of said gate electrode by not more than L/4.

2. The field effect transistor according to claim 1, wherein a value of said impurity concentration peak of the first conductivity is at least $8.0 \times 10^{16}$ cm$^{-3}$.

3. The field effect transistor according to claim 1, wherein a length of said gate electrode is not more than 0.35 μm.

4. The field effect transistor according to claim 3, wherein a value of said impurity concentration peak of the first conductivity is at least $1.0 \times 10^{17}$ cm$^{-3}$.

5. The field effect transistor according to claim 1, wherein a length of said gate electrode is not more than 0.25 μm.

6. The field effect transistor according to claim 5, wherein a value of said impurity concentration peak of the first conductivity is at least $5.0 \times 10^{17}$ cm$^{-3}$.

7. The field effect transistor according to claim 1, wherein a length of said gate electrode is not more than 0.15 μm.

8. The field effect transistor according to claim 7, wherein a value of said impurity concentration peak of the first conductivity is at least $8.0 \times 10^{17}$ cm$^{-3}$.

* * * * *